(12) United States Patent
Allison et al.

(10) Patent No.: US 6,849,924 B2
(45) Date of Patent: Feb. 1, 2005

(54) WIDE BAND CROSS POINT SWITCH USING MEMS TECHNOLOGY

(75) Inventors: Robert C. Allison, Rancho Palos Verdes, CA (US); Jar J. Lee, Irvine, CA (US)

(73) Assignee: Raytheon Company, Waltham, MA (US)

( * ) Notice: Subject to any disclaimer, the term of this patent is extended or adjusted under 35 U.S.C. 154(b) by 270 days.

(21) Appl. No.: 10/143,180

(22) Filed: May 9, 2002

(65) Prior Publication Data

US 2003/0210579 A1 Nov. 13, 2003

(51) Int. Cl.[7] .............................................. H01L 23/58
(52) U.S. Cl. ...................... 257/635; 257/736; 257/750; 438/50; 438/750; 365/200
(58) Field of Search ................................ 257/635, 736, 257/750, 278, 324; 438/53, 108, 750; 365/200; 385/14; 333/262

(56) References Cited

U.S. PATENT DOCUMENTS

| | | | | |
|---|---|---|---|---|
| 6,046,659 A | * | 4/2000 | Loo et al. | 333/262 |
| 6,607,934 B2 | * | 8/2003 | Chang et al. | 438/50 |

* cited by examiner

*Primary Examiner*—David Nelms
*Assistant Examiner*—Long Tran (74) *Attorney, Agent, or Firm*—Leonard A. Alkov; Karl A. Vick

(57) ABSTRACT

A multilayer switching assembly for switching high frequency signals has MEMS structures on a ceramic substrate having a top surface, a bottom surface and a plurality of insulating layers. The insulating layers are separated by a first conductor and a second conductor. The first conductor is connected to a ground potential. The second conductor is separated from the first conductor by one of the insulating layers. The second conductor presents a specific impedance (50 ohms) with respect to the first conductor to high frequency signals traveling on the second conductor.

64 MEMS structures are mounted on the top surface. Each MEMS has an input, an output, and a control. The input connected to the second conductor. The output is connected to a coplanar waveguide placed on the top surface. The control is connected to the bottom surface.

The input to each MEMS is electrically shielded from the output and from the control by a third conductor connected to the first (grounded) conductor. The third conductor traverses one or more of the insulating layers thereby acting as a shield and precluding the high frequency signals presented to the input from propagating to the output and to the control. The 64 MEMS are arranged in a square 8 by 8 matrix, as well as their controls. High frequency inputs and outputs to be switched by the MEMS are placed on the periphery of the substrate to further enhance the separation of signals. Terminating resistors (50 ohms) are also placed near the periphery.

4 Claims, 9 Drawing Sheets

WIDE BAND CROSS POINT SWITCH USING MEMS TECHNOLOGY

BACKGROUND OF THE INVENTION

1. Field of invention

This invention relates to the field of telephony, particularly forming a cross point switch using Microlectromechanical systems (MEMS) structures mounted on a ceramic substrate.

2. Description of the Related Art

One aspect of the art of telephony involves interconnecting any of a plurality of inputs, N, to any of a plurality of outputs M. It is desired to connect an input signal, part of N, carried on an incoming line, to an output, part of M, carried on an outgoing going line. This function is generally performed by an N×M matrix of crosspoints capable of interconnecting any member of N to any member of M. Such a structure of M×N crosspoints is a coordinate switch, that is, a rectangular array of crosspoints in which one side of the crosspoints is multiplied in rows and the other side in columns. A crosspoint is ideally a two state switching device having low transmission impedance in one state and very high in the other, as defined by the Bell System Technical Journal, September 1964. When the number of crosspoints provided within the switch is N×M, the coordinate switch has full availability and is non-blocking, that is, at all times there is a path between any pair of idle lines connected thereto, regardless of the number of paths already occupied.

A crosspoint in early mechanical telephone exchanges was a copper bar sliding between two contacts for providing the necessary interconnection between an input and an output as well as isolation between input and output. With the advent of electronic telephone exchanges, such as Bells' Electronic Switching System (ESS line), the switching function was performed by solid state devices such as Field Effect Transistors, Metal Oxide Field effect transistors, CMOS gates and the like. Unfortunately, as the size of the N×M matrix grows, it becomes more difficult to provide one single, massive, stage to interconnect all inputs and outputs. Instead, for example, a multi stage network is implemented to reduce the total number of crosspoints as compared to the N×M matrix. T. L. Bowers, in *Derivation of Blocking Formulae for 3 Stage "Folded" switching arrays* IEEE paper No CP 63-1462 calculates the number of crosspoints for a reduced (3 stage) configuration. The limitation to the number of stages is that, unlike the single stage design, the switched signal has to traverse a plurality of crosspoints within the exchange. Thus, if the basic element of a switch, the crosspoint, is lossy, traversing a series concatenation of them may attenuate the signal to a level where it is no longer usable, or the signal to noise ratio reduced below acceptable levels.

One approach for reducing the attenuation of a switching element is to use MEMS type structures having low insertion loss to perform the switching function. Micro-Electro-Mechanical Systems (MEMS) is the integration of mechanical elements, sensors, actuators, and electronics on a common substrate through the utilization of microfabrication technology. While typical electronics elements such as transistors are fabricated using integrated circuit (IC) process sequences (e.g., CMOS, Bipolar, or BICMOS processes), micromechanical MEMS structures are fabricated using process compatible micromachining processes that selectively etch away parts of the silicon wafer or add new structural layers to form the mechanical and electromechanical devices.

An example of a MEMS structure having a bidirectional rotating member having two positions is described in U.S. Pat. No. 6,072,686, incorporated herein by reference in its entirety. Another example of a MEMS structure for microwave (millimeter wave) applications is described in U.S. Pat. No. 6,046,659, incorporated herein by reference in its entirety.

With the advent of higher operating frequencies, forming a switching matrix for use in telephony using MEMS structures requires special considerations subject of this invention.

SUMMARY OF THE INVENTION

A multilayer switching assembly for switching high frequency signals has MEMS structures on a ceramic substrate having a top surface 500, a bottom surface and a plurality of insulating layers (510,512,514). The plurality of insulating layers are separated by conducting layers, such as a first conductor 502 and a second conductor 504. Another conductor, 506, at ground potential, forms a stripline in conjunction with second conductor 504 and first conductor 502. The first conductor 502 is also connected to a ground potential. The second conductor 504 is separated from the first conductor 502 by one of the insulating layers. The second conductor 504, as part of a stripline, presents a specific impedance (50 ohms) with respect to the first conductor to high frequency signals traveling on the second conductor.

64 MEMS structures (e.g. 540,708,716,718,720) are mounted on the top surface. Each MEMS has an input, an output, and a control. The input connected to the second conductor. The output is connected to a coplanar waveguide (508) placed on the top surface (500). The control is connected to the bottom surface.

The input to each MEMS is electrically separated from the output and from the control by a third conductor connected to the first (grounded) conductor. The third conductor traverses one or more of the insulating layers thereby acting as a shield and precluding the high frequency signals presented to the input from propagating to the output and to the control.

The 64 MEMS are arranged in a square 8 by 8 matrix, as well as their controls. High frequency inputs and outputs to be switched by the MEMS are placed on the periphery of the substrate to further enhance the separation of signals. Terminating resistors (50 ohms) are also placed near the periphery.

DETAILED DESCRIPTION

1. Introduction

This invention introduces the notion of using MEMS structures on a common substrate to form, for example, an 8 by 8 switching matrix, as well as other switching matrix configurations. Special provisions are made to isolate the input from the output, thus insuring minimal signal leakage for OFF conditions across a MEMS structure.

Figure 1:
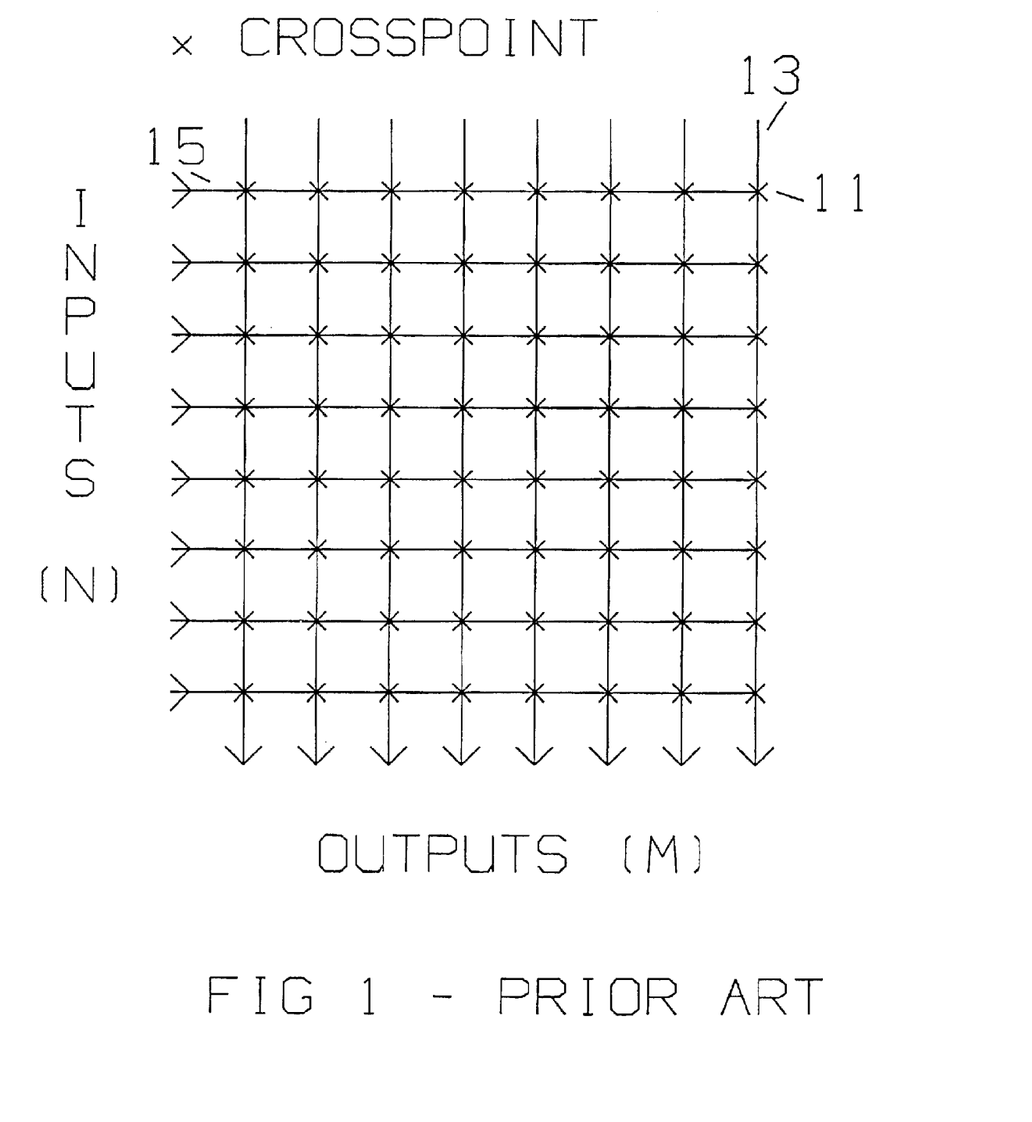
FIG. 1 is an exemplary 8×8 crosspoint switch of the prior art.

FIG. 1 shows a an 8 by 8 matrix of crosspoints of the prior art. Any of 8 inputs can be connected with any of 8 outputs. For example, input 15 is connected to output 13 using cross point switch 11. Because there are 64 cross point switches, this is a full availability, non-blocking switching matrix. Each of the 64 switches is closed or opened in accordance with a control signal applied to each switch. The control signals are not shown.

Figure 2:
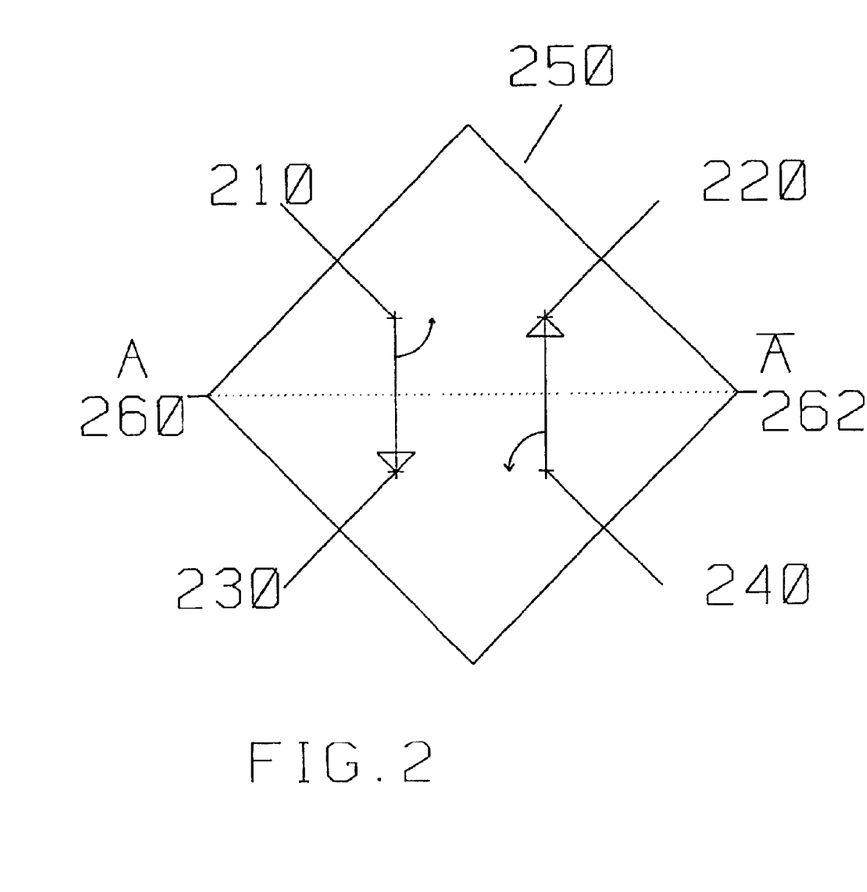
FIG. 2 is an exemplary schematic of a switching building block using a typical MEMS structure.

FIG. 2 shows the diagram of a typical MEMS structure 250, a building block of the present invention. In FIG. 2, a signal applied to terminal 210 can be switched to either terminal 230 or 220 upon a command applied to terminal 260 and 262. Similarly, a signal applied to terminal 240, can be routed to either terminal 220 or 230 in accordance with command input A on terminal 260 and its complement $\overline{A}$ on terminal 262. The MEMS structure used in this application, is further described in FIG. 4, has four command inputs, paired in two groups of two. The signals applied to the two groups are the complement of each other. Only two of the input signals are shown for clarity in FIG. 2 and FIG. 4.

Figure 3:
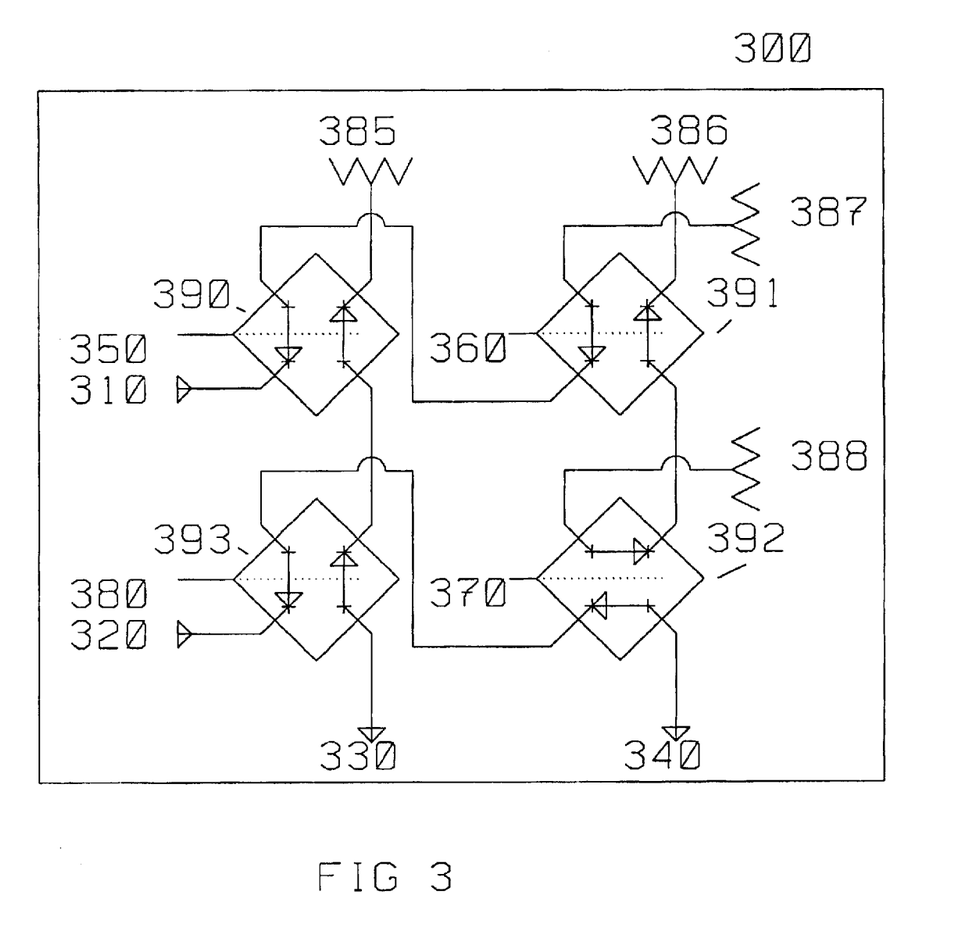
FIG. 3 is an exemplary schematic of a 2 by 2 switch using 4 MEMS structures.

FIG. 3 shows a 2 by 2 switch 300 using four MEMS structures. The four MEMS structures, 390, 391, 392 and 393 are interconnected to form the 2 by 2 switch having two inputs 310 and 320, and two outputs, 330 and 340 respectively, As shown, input 310 is connected into termination 387, while input 320 is connected into output 340. Terminations 385, 386,387, and 388 absorb high frequency signals presented to them (generally with no, or negligible reflection). Control input 350 controls the position of interconnect means within MEMS structure 390. Similarly, control 360 operates MEMS 391, control 370 operates MEMS 392, while control 380 operates MEMS 393. It is clear to one skilled in the art that interconnecting 16 such 2 by 2 switches, and eliminating the redundant terminations, will yield an 8 by 8 matrix, similar in function to the one shown in FIG. 1.

Figure 4:
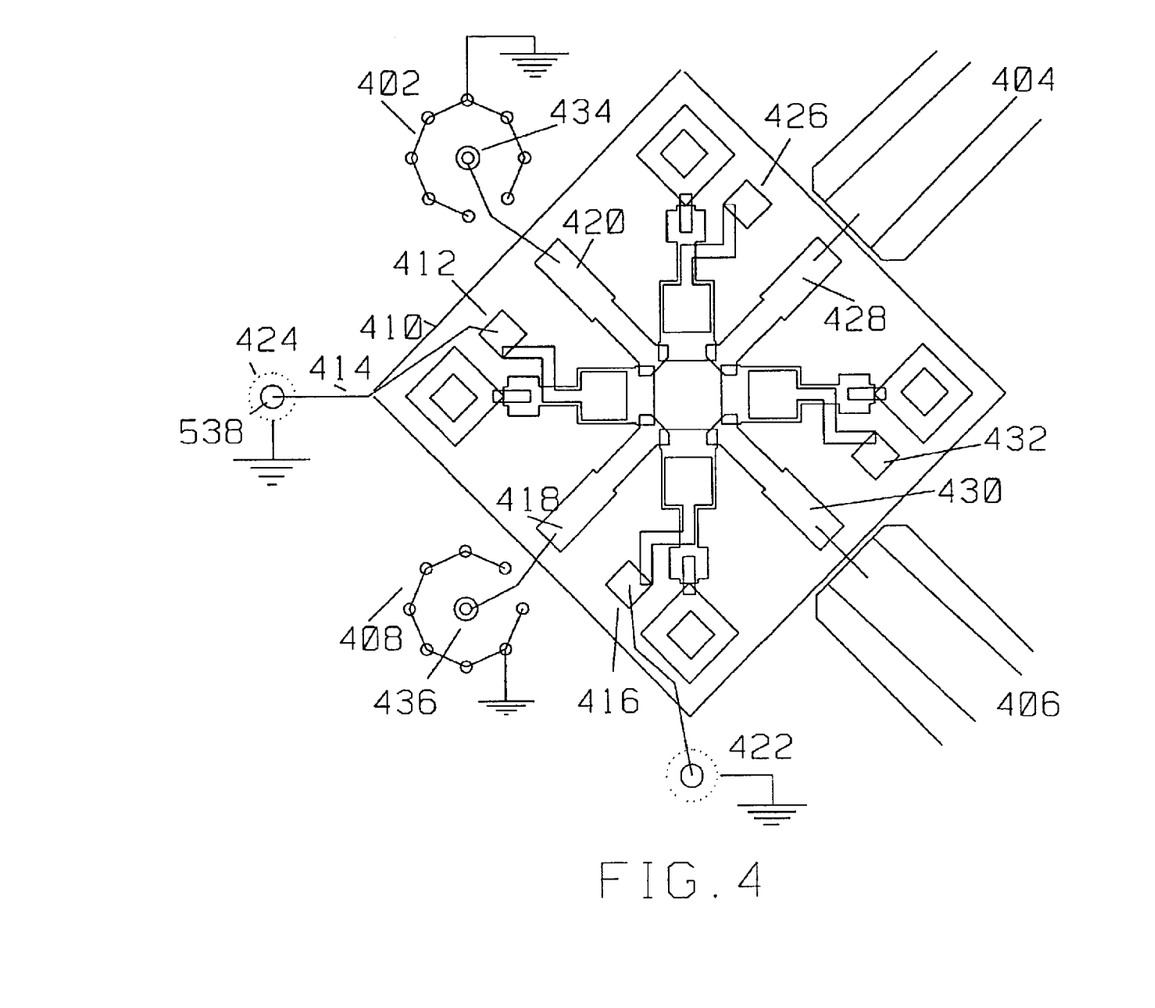
FIG. 4 is an exemplary detail of MEMS structures reflecting FIG. 2.

FIG. 4 shows a multilayer switching assembly for switching a high frequency signal using the principles of this invention. This assembly comprises a MEMS structure 410 on a ceramic substrate. The ceramic substrate is made up of layers of ceramic, insulating material and conductive material, typically gold, silver, copper, palladium or other thick film conductor metal. The MEMS structure has a first terminal 420, a second terminal 428, a third terminal 430, and a fourth terminal 418. Also provided is a first control input 412, a second control input 416, a third control input 432, and a fourth control input 426. Using the MEMS structure 410, the high frequency signal presented to said first terminal 420 can be connected from said first terminal 420 to either said second terminal 428 or said fourth terminal 418 in response to a control signal applied to said first control input 412 and said second control input 416. Control terminal 412 is connected to control terminal 432 using a bond wire (bond wire not shown for clarity). Similarly control terminal 416 is connected to control terminal 426 using a bond wire. The control signal presented to 416 and 426 is always logically opposite to that presented to 432 and 412.

Using some references to the vertical structure described in FIG. 5 below, the MEMS structure 410 is mounted on an upper surface 500 of a first (ceramic) insulating layer 510, a lower surface of said first insulating layer separated from an upper surface of a second insulating layer 512 by a ground conductor 502 connected to ground potential. A signal conductor 504 is placed on a lower surface of said second insulating layer 512.

A first descender 434, made of a conductive material, traverses said first insulating layer 510 and said second insulating layer 512, and is connected to a signal conductor within signal layer 504, layer 504 located on the lower surface of said second insulating layer 512. First descender 434 is also connected to said first terminal 420.

First descender 434 is enveloped at a distance by a first conductive shield 402. This first conductive shield 402 traverses vertically the first insulating layer 510 and the second insulating layer 512 as well as the third layer 514 and the fourth layer 514. Conductive shield 402 is connected to ground conductor 502 and 506 so as to shield descender 434. Shield 402 precludes high frequency signal leakage within the ceramic layers. Shield 402 is shown to be made of multiple conductive vias vertically traversing the layers. These vias are arranged in a circular pattern, as exemplified in 402 and 408, thus forming the external sheath of a coaxial structure. The distance between descender 434 and shield 402 is chosen based on ceramic material characteristics, for a specific impedance of the coaxial structure to be presented by said first descender to the high frequency signal. This is typically 50 ohms.

A second descender 436 traverses, like first descender 434, the first insulating layer 510, the second insulating layer 512, and is connected to a second signal conductor, part of layer 504, on said lower surface of said second insulating layer 512. Second descender 436 is also connected to the fourth terminal 418. The second descender (436) is enveloped at a distance by a second conductive shield 408. This second conductive shield 408 traverses vertically the first insulating layer 510 and the second insulating layer 512. The second conductive shield 408 is connected to ground conductor 502. The distance is chosen to present a specific impedance by the first descender to the high frequency signal.

A first coplanar waveguide (CPW) 404 is connected to the second terminal 428. This coplanar waveguide is positioned on the upper surface 500 of the first insulating layer 510. The first coplanar waveguide presents the typical 50 ohm specific impedance to the high frequency signal.

Similarly, a second coplanar waveguide 406 is connected to the third terminal 430. This second coplanar waveguide is also positioned on the upper surface 500 of the first insulating layer 510. The second coplanar waveguide also presents a 50 ohm specific impedance to the high frequency signal.

Control signals are delivered to first control 412 using a control conductor 538 traversing all layers of the ceramic package.

Figure 5:
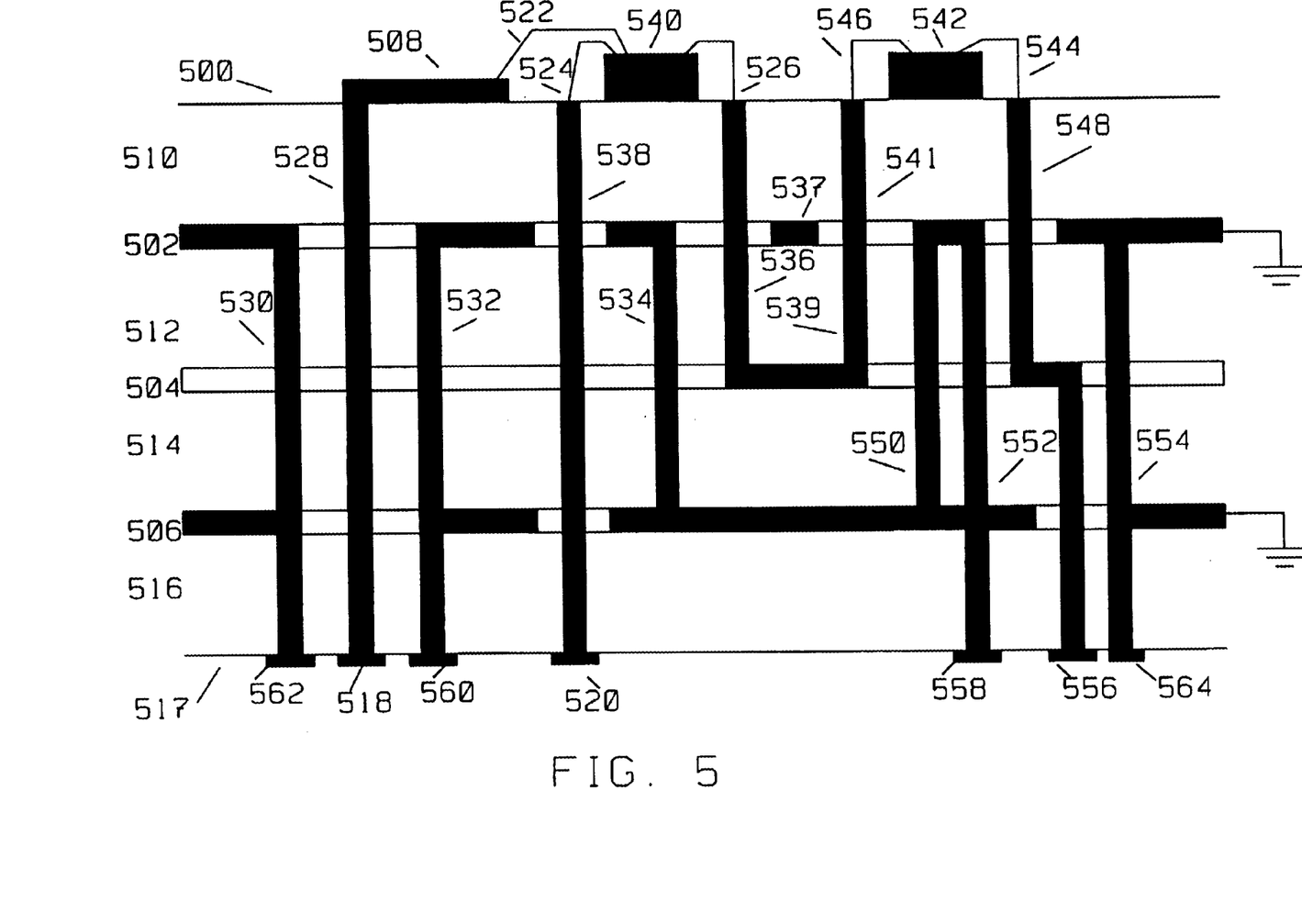
FIG. 5 is an exemplary schematic of the layers used in the present invention vertical layout a FIG. 6 is an exemplary schematic of the layout of two MEMS structures on a substrate.

Shield 424 around conductor 538 exemplifies shielding conductors 532 and 534 in FIG. 5. Typically, bond wire 414 connects control conductor 538 to first control 412. A typical bond wire performing the same function is shown as bondwire 524 in FIG. 5. The other end of control conductor 538 is on control solder bump 520, on the bottom surface 517 of the ceramic package. Control solder bump 520 connects with control pins shown such as 920 and 922 in FIG. 9.

Similarly, shield 422 shields control signals for second control input 416 from high frequency interference.

Typically, high frequency signals have wavelengths between 0.01 millimeters and 100 millimeter.

FIG. 5 details the vertical extent of a multilayer switching assembly for switching high frequency signals using MEMS structures 540, 542. This assembly comprises a substrate having a first layer 510 with an upper surface 500, a second layer 512, a third layer 514, and a fourth layer 516 with a bottom surface 517.

The first layer 510, the second layer 512, the third layer 514, and the fourth layer 514 are made of an insulating material, typically a ceramic. The first layer 510 is separated from the second layer 512 by a first conducting layer 502. The second layer 512 is separated from the third layer (514) by a second conducting layer (504), having segments, such as segment 539, part of the second conducting layer. Each of the segments, such as 539 is electrically separate from the rest of the layer.

The third layer 514 is separated from the fourth layer 516 by a third conductor 506. The first conductor 502 and the third conductor 506 are connected to ground potential.

The segmented, second conducting layer 504 is spaced from the grounded first conductor 502 and third conductor 506 so as to form a stripline having a characteristic impedance along said segmented second layer 504.

A center conductor 528 traversing vertically the first layer 510, the second layer 512, the third layer 514, and the fourth layer 514. This center conductor carries the high frequency signals to be switched by the MEMS structures 540, 542.

An outer conducting via 530, 532 is formed around said center conductor 528. This outer via 530, 532, in the manner of 408, traverses the second layer 512, the third layer 514, and the fourth layer 516. The outer via 530, 532 is made of a conducting material, forms a conductive circle as shown in 402 and 408, and is electrically connected to the first conductor 502 and the third conductor 506, thus to ground. The outer via 530, 532 is spaced from the center conductor (528) to maintain the characteristic 50 ohm impedance along the length of said center conductor 528. The function of the outer via 530, 532 is to shield the high frequency energy traveling along the center conductor 528 from propagating outside its boundaries and interfering with other elements within the assembly.

Center conductor 528 is connected to a first end of a coplanar waveguide (CPW) 508. The CPW 508 is placed along the upper surface 500. The second end of CPW 508 is connected using an input bondwire 522 to a first high frequency input of a first MEMS structure 540.

A control conductor 538 traverses the first layer 510, the second layer 512, the third layer 514, and the fourth layer 514, to connect a control bondwire 524 to a control input contact point 520 on the bottom surface 517 of the fourth layer 516. The control bondwire (524) is also connected to a control input of the first MEMS structure 540. At least two such control inputs are required to operate the MEMS structure 540.

On the other side of the MEMS switch, a first conducting descender 536 is connected to an output of the first MEMS structure 540 using a high frequency output bondwire 526. This first conducting descender 536 traverses vertically the first layer 510 and the second layer (512). The first conducting descender (536) is also connected to a first segment (539). The first segment 539 is part of the second conductive layer 504. The same first segment 539 is connected to a second riser 541. This second riser 541 traversing vertically the first 510 and the second layer 512, and connected to a second high frequency input bondwire 546. This second input bondwire 546 is connected to a second MEMS structure 542.

Vertical conducting structures 550, 552 and 554 further insure that a ground layer is interposed between the input and output sections of a MEMS structure, as well as precluding propagation of high frequency energy along the layers. Vertical structure 552 connects to the bottom surface 517 using solder bump 558. Similarly, conducting structure 554 connects to the bottom surface 517 using solder bump 564. 558 and 564 provide a convenient means for making the connection to ground. Multiple ground connections are made using solder bumps 562 and 560.

Figure 6:
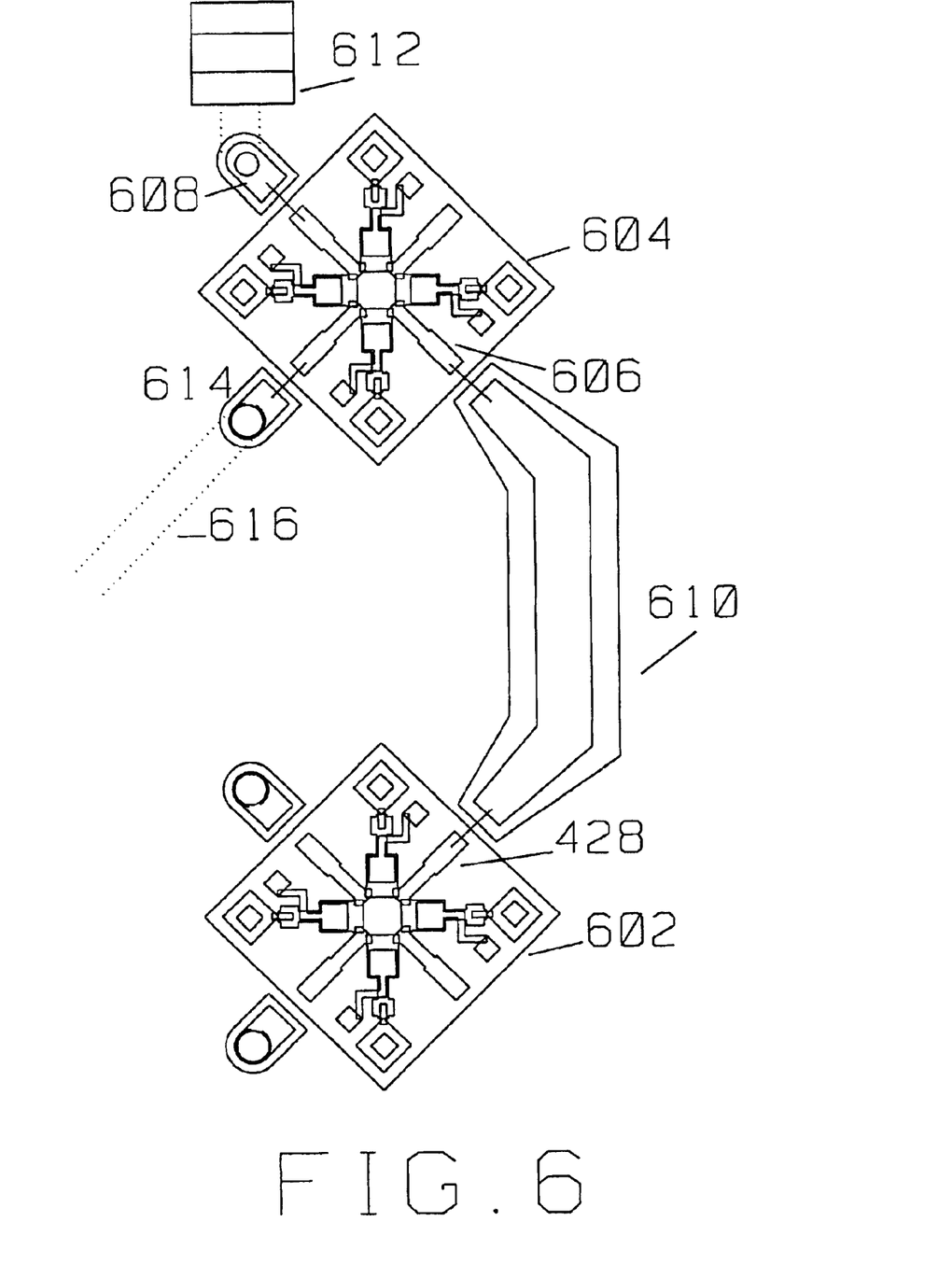

FIG. 6 shows a multilayer switching assembly for switching a high frequency signal comprising two MEMS structures. A first MEMS structure 602 (as in FIG. 4, item 410) has a first terminal 420, a second terminal 428, a third terminal 430, and a fourth terminal 418 to carry high frequency signals. A first control input 412, a second control input 416, a third control input 432, and a fourth control input 426 are used to control the high frequency signal flow between the four terminals as shown in FIG. 2.

A high frequency signal presented to said first terminal 420 can be connected from the first terminal 420 to either the second terminal 428 or the fourth terminal 418 in response to a control signal applied to the first control input 412 and said second control input 416.

A second MEMS structure 604 having a CPW terminal 606, an output 608, and an input 614 is also provided.

The first MEMS structure 410,602 and the second MEMS structure 604 are mounted, in accordance with FIG. 5, on an upper surface 500 of a first insulating layer 510, a lower surface of the first insulating layer separated from an upper surface of a second insulating layer 512 by a ground conductor 502 connected to ground potential. A signal conductor layer 504 is placed on a lower surface of said second insulating layer.

A first descender 434 traverses the first insulating layer 510 and the second insulating layer 512, and is connected to a signal conductor 539 on the lower surface of the second insulating layer 512. The first descender 434 is also connected to the first terminal 420.

The first descender 434 is enveloped at a distance by a first conductive shield, e.g. 402 or 408. This first conductive shield (402 or 408) traverses the first insulating layer 510 and the second insulating layer (512). The first conductive shield 402 is connected to ground conductors 502 and 506. The distance between shield 402 and first descender 434 is chosen for a specific impedance to be presented by the first descender to the high frequency signal, typically 50 ohms.

A second descender 436 traverses the first insulating layer 510 and the second insulating layer 512, and is connected to a second signal conductor 539, part of the signal conductor layer 504 on the lower surface of the second insulating layer 512. The second descender 436 is also connected to the fourth terminal 418.

The second descender 436 is enveloped at a distance by a second conductive shield (e.g. 402 or 408). This second conductive shield (402,408) traverses the first insulating layer 510 and the second insulating layer 512. The second conductive shield 408 is connected to the ground conductors 502 and 506. The distance between the shield and the second descender is chosen for a specific impedance to be presented by the first descender to the high frequency signal. The specific impedance is, as in the case of the first descender, 50 ohms.

A coplanar waveguide 610 is connected to the second terminal 428 of the first MEMS structure 602 and the CPW terminal 606 of the second MEMS structure. The coplanar waveguide 610 is positioned on the upper surface 500 of the first insulating layer 510. The coplanar waveguide 610 presenting the 50 ohm specific impedance to the high frequency signal.

A terminating resistor 612 is positioned on the upper surface 500. The terminating resistor 612 is chosen to match the specific impedance to said high frequency signal, 50 ohms. The terminating resistor 612 is connected to the output 608. The input 614 is connected to a second signal conductor 616. The second signal conductor 616 is on the lower surface of the second insulating layer 512. Positioning the high frequency signal from input 614 on another layer, separate and distinct form the layer where CPW 610 is reduces the interference between signals, increasing the separation between on and off states of MEMS structure 604.

Figure 7:
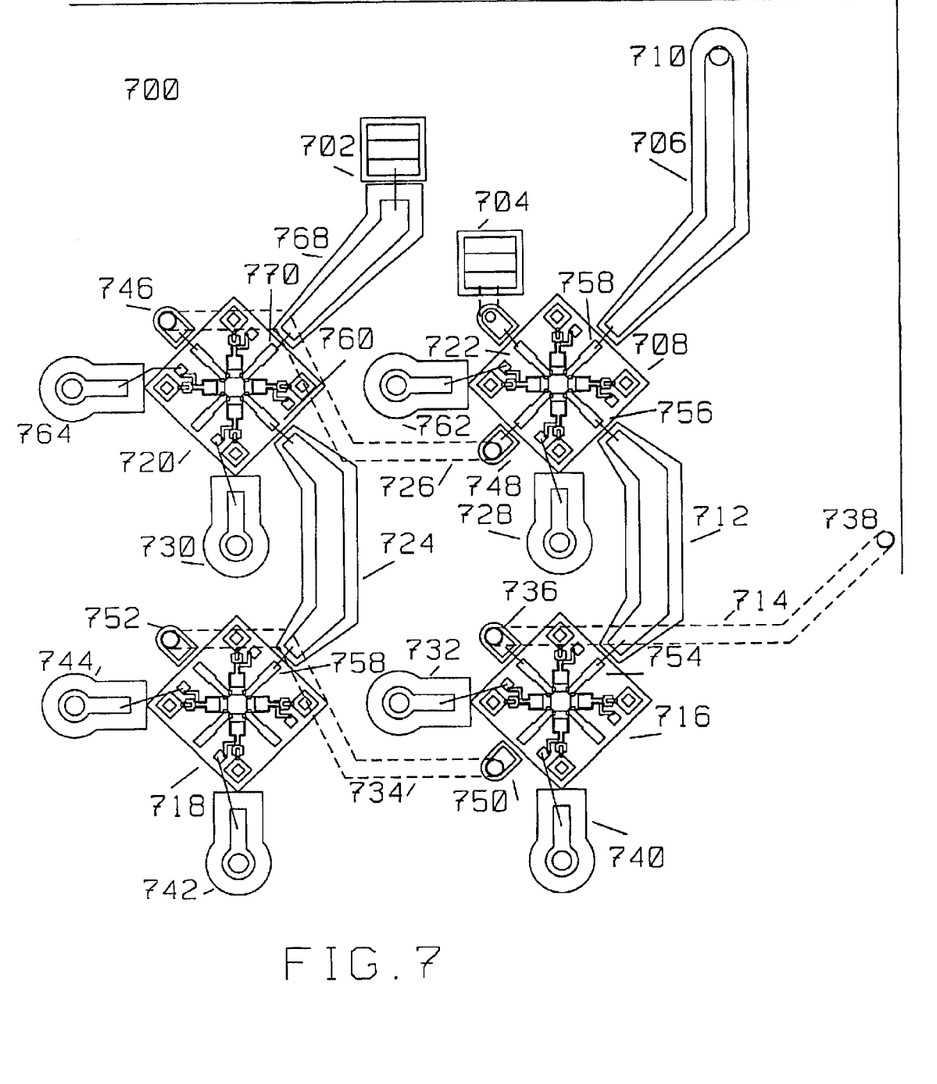
FIG. 7 is an exemplary schematic of the layout of four MEMS structures on a substrate

FIG. 7 further details the multilayer switching assembly for switching a high frequency signal subject to this invention. The assembly shown shows four of the 64 MEMS detailed in FIG. 8. The four MEMS shown in FIG. 7 comprise a first MEMS structure 708 (same as 410 in FIG. 4) having a first terminal 758, a second terminal 756, a third terminal 748, and a fourth terminal 722. Only a first control input 762, and a second control input 728 are shown. A third control input (e.g. 432), and a fourth control input (e.g. 426) are also part of MEMS 708, as detailed in FIG. 4, and connected using a bondwire, but not shown for clarity. The high frequency signal to be switched is presented to the first terminal 758 using first high frequency pin 710. The high frequency signal and can be connected from the first terminal 758 to either the second terminal 756 or the fourth terminal 722 in accordance with diagram of FIG. 2, in accordance with the structure of FIG. 4. The high frequency signal is switched in response to a control signal applied to the first control input 762 and the second control input 728. The signal applied to control input 762 is logically opposite (opposite polarity) to the one applied to control input 728. If control input 762 is applied, control input 728 also needs to be applied, but of opposite polarity.

The first terminal 758 is connected to a first CPW 706. This first CPW is connected to a first high frequency signal pin 710. Pin 710 is located near the periphery of the substrate 700 to minimize interference with other parts of the assembly.

A second MEMS structure 716, also having a CPW terminal 754, an output 736, and an input 750, a third control input 732 and a fourth control input 740 works in conjunction with the first MEMS structure 708. A second CPW 712 connects from CPW terminal 754 on the second MEMS structure 716 to the second terminal 756 of the first MEMS structure 708.

The first MEMS structure 708, the second MEMS structure 716, the first CPW 706 and the second CPW 712 are mounted on an upper surface 700 of a first insulating layer 510 of the ceramic substrate. As shown in FIG. 5, the lower surface of the first insulating layer is separated from an upper surface of a second insulating layer 512 by a ground conductor 502 connected to ground potential. A signal conductor layer 504 is on a lower surface of the second insulating layer.

A first descender 536 from output 736 of the second MEMS traverses the first insulating layer 510 and the second insulating layer (512), and is connected to a signal conductor 714 on said lower surface of said second insulating layer 512. This signal conductor 714 is a segment of the signal conductor layer (504), connects the first descender (536), also connected to said output 736, to a second high frequency pin 738 located on the periphery of the substrate 700.

The first descender 536, connected to output 736, is enveloped at a distance by a first conductive shield (534, 537,550). The first conductive shield traverses the first insulating layer 510 and the second insulating layer 512 and the third insulating layer 514. The first conductive shield (534,537,550) is connected to the ground conductor 502. The distance chosen for a specific impedance to be presented by the first descender 536 to the high frequency signal.

Similarly, a second descender 746 (similar to descender 536), from fourth MEMS 720, traverses the first insulating layer 510 and the second insulating layer 512, and is connected to a second signal conductor 726 (similar to 539), part of said signal conductor layer 504 on said lower surface of said second insulating layer 512. This second descender 746 is also connected to a high frequency fifth terminal on a fourth MEMS 720.

A first terminating resistor 704 is positioned on the upper surface 700. This terminating resistor 704 chosen to match the specific impedance to the high frequency signal. The terminating resistor 704 is connected to the fourth terminal 722.

The first control input 762, the second control input 728, the third control input 732 and the fourth control input are uniformly located on the substrate 700 so that the spacing separating the first control input 762 from the second control input 728 is equal to the spacing separating the third control input 732 from the fourth control input 740. The same spacing also separates the second control input from the third control input.

The first high frequency output pin 710 and the second high frequency output pin 738 are located on the periphery of said substrate 700, thus minimizing interference.

Figure 8:
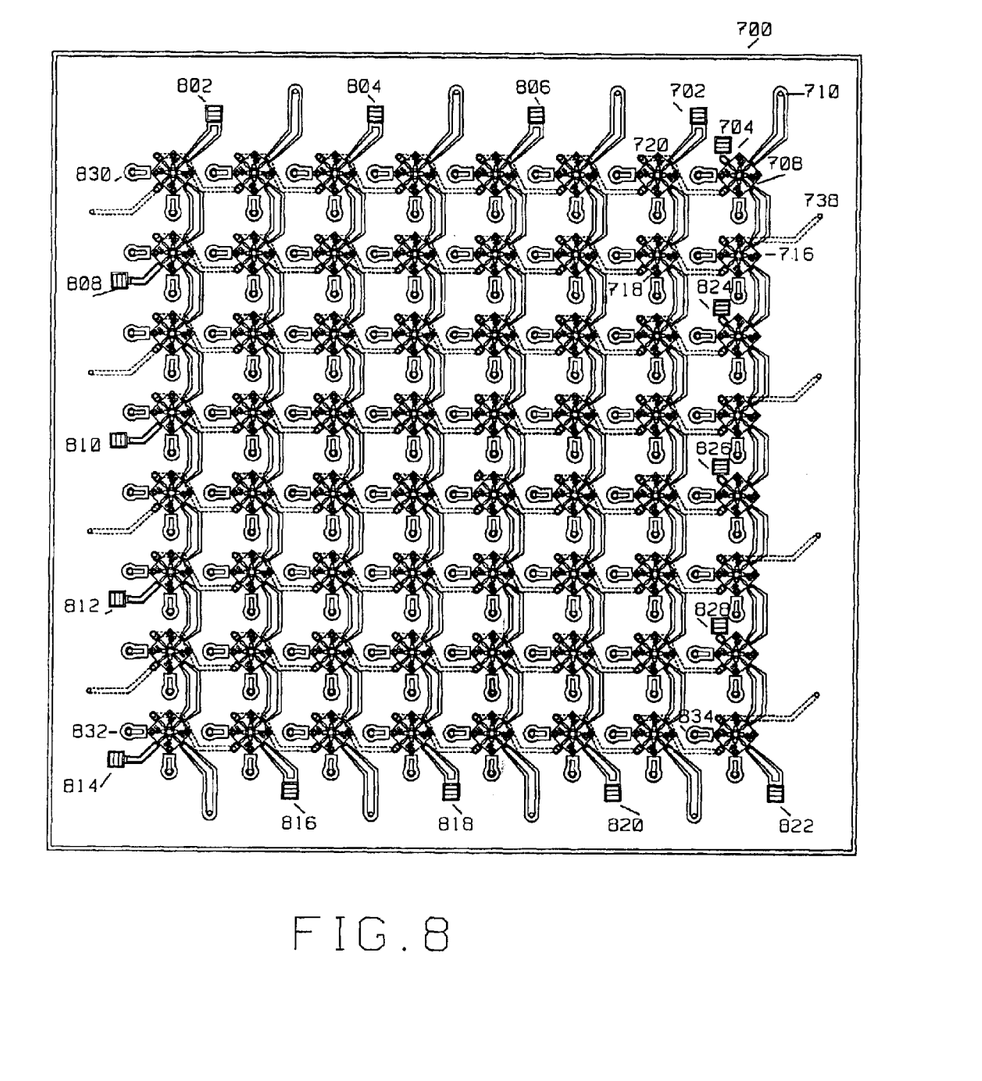
FIG. 8 is an exemplary schematic of the layout of 64 MEMS structures forming an 8 by 8 switching matrix

FIG. 8 details the layout of the present invention for a switching assembly for switching any of 8 incoming high frequency signals to any of 8 outputs (8 by 8 switch). It comprises 64 MEMS structures,(e.g. 708,716,718,720) each of said 64 MEMS structures having a first terminal, a second terminal, a third terminal and a fourth terminal, a first control terminal and a second control terminal in accordance with FIG. 7.

The 64 MEMS structures are on a multilayer substrate having a square periphery, the square periphery having four equal sides, a top surface (500), a bottom surface and a plurality of insulating layers (510,512,514). The insulating layers, detailed in FIG. 5, are separated by a first conductor (502) and a second conductor (504), said first conductor (502) connected to a ground potential, said second conductor (504) separated from said first conductor (502) by one of said insulating layers, said second conductor presenting a specific impedance, typically 50 ohms, with respect to said first conductor to high frequency signals traveling on the second conductor 504. Conductor 504 forms the center conductor of a stripline, where layers 502 and 506 form the ground conductors of the stripline.

The 64 MEMS structures mounted on said top surface forming a first 8 by 8 array, where all the members of the array are equally spaced from each other. The array has 8 inputs and 8 outputs disposed on the periphery of the substrate.

Each of 64 second terminals (e.g. 428 in FIG. 4, 754 in FIG. 7) and 64 third terminals (e.g. 430 in FIG. 4, 756, 760 in FIG. 7) is connected to a CPW, the 64 CPWs are formed on the top surface (500) of the ceramic layers.

Each of the 64 first terminals (420) and the 64 fourth terminals (418) is connected to a descender. Thus, 64 descenders are connected to 64 second conductors 504.

Each of the 64 first control terminals for each MEMS switch are placed to form a second 8 by 8 array, its members also equidistantly spaced from each other.

Furthermore, each of the second 64 second control terminals are placed to form a third 8 by 8 array. Again its members are equidistantly spaced from each other.

The typical high frequency signals can have wavelengths between 0.01 millimeters and 100 millimeter. These high frequency input signals are transmitted t the 8 by 8 switching matrix by using package pins located outside said first array made up of MEMS switches, or the second and third array, along the periphery of the multilayer substrate.

16 resistors matching said characteristic impedance are provided on said multilayer substrate and connected to MEMS. Resistor 702 is connected to MEMS 720, while resistor 704 is connected to MEMS 708. Of the 16 resistors, 12 are located outside the first array, the second array and the third array. These are 702, 802, 804, 806, 808, 810, 812, 814, 816, 818, 820, 822. These 12 resistors aligned along three sides of said four sides of the substrate, as shown. Resistors 824, 826 and 828 are located within the confines of array of MEMS. Resistor 704 is not aligned, but is proximate to MEMS 708.

Figure 9:
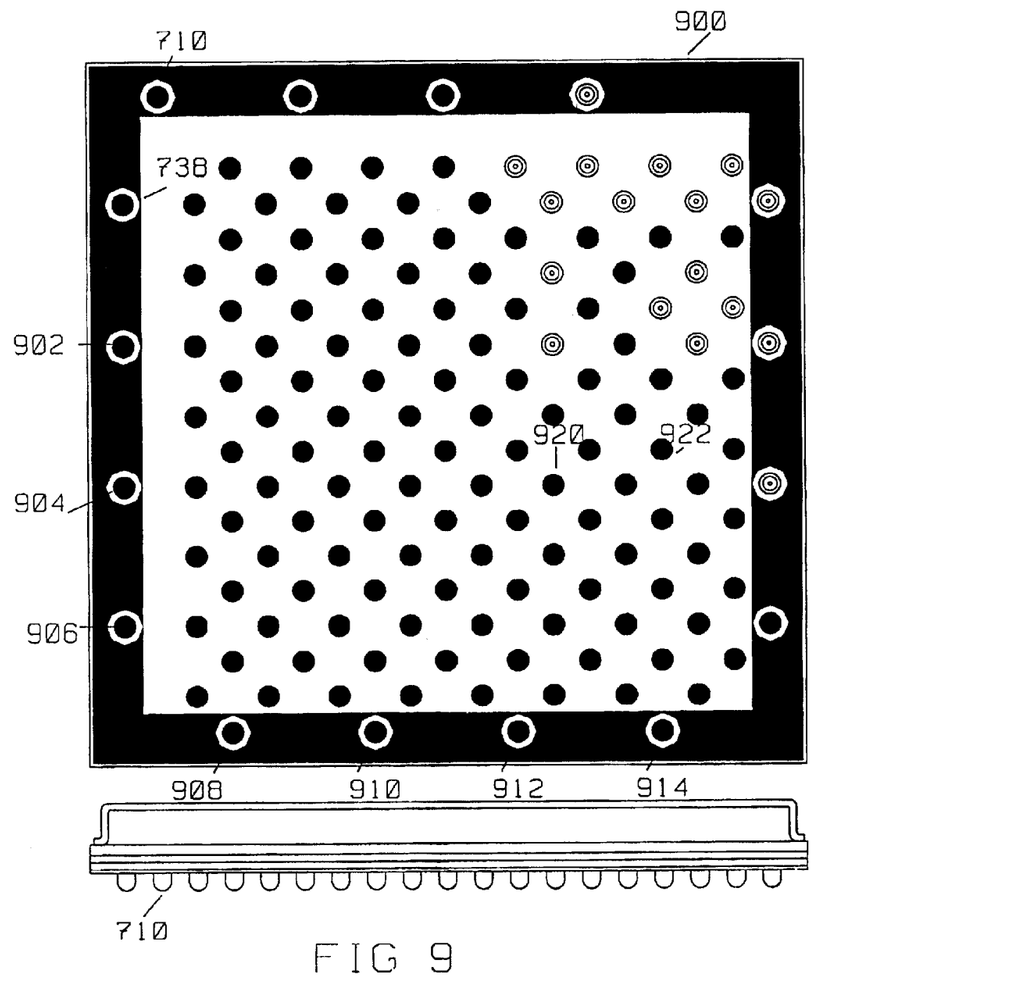
FIG. 9 is an exemplary schematic of the layout of the input/output pins on the package associated with the 8×8 matrix of FIG. 8.

FIG. 9 shows the bottom view of terminal arrangements of the package using the 64 MEMs of FIG. 8. Sample terminals 710, 738, 902, 904, 906, 908, 910, 912 and 914 on the periphery of the package 900 carry high frequency signals.

Sample terminals 920 and 922 carry control signals to each of the particular MEMS they are directly located under. The path of a typical control signal is from a terminal such as 920, to a solder bump 520 (in FIG. 5), to a control conductor 528, to one of two control inputs (e.g. 728 or 762) to the MEMS 540 via control bondwire 524.

Terminals such as 920 or 922 or 902 can be pins, solder bumps or any convenient means for making an electrical inter-connection as applicable to the package or substrate level.

A method for building a multilayer switching assembly for switching high frequency signals using MEMS structures (540,542) is also envisioned. The method comprises the steps of:

1) Mounting a MEMS structure (540) on a ceramic substrate. The substrate has a top surface (500), a bottom surface and a plurality of insulating layers (510,512,514), said insulating layers separated by a first conductor (502) and a second conductor (504).

The first conductor (502) is connected to a ground potential. The second conductor (504) is separated from the first conductor (502) by one of the insulating layers. The second conductor presents a specific impedance with respect to the first conductor to the high frequency signals traveling on the second conductor. Another conductor is typically provided to form a stripline structure. The MEMS structure (540) mounted on the top surface has an input, an output, and a control.

2) Connecting the input of the MEMS to the second conductor.

3) Connecting the output of the MEMS to a coplanar waveguide (508) placed, or etched, on the top surface (500).

4) Connecting the control of the MEMS to the bottom surface of the multilayer assembly.

5) Separating the input from the output and from the control by a third conductor connected to the first conductor. The first conductor is connected to ground. The third conductor traverses one or more of the insulating layers thereby precluding the high frequency signals presented to said input from propagating to said output and to said control and maintaining a characteristic impedance (typically 50 ohms) over the length of the third conductor.

All references cited in this document are incorporated herein in their entirety.

Although presented in exemplary fashion employing specific embodiments, the disclosed structures are not intended to be so limited. For example, the principles used to form the 8 by 8 array can be used to form a 3 by 12 array, or any combination of MEMS switches using the principles of signal shielding and separation disclosed herein.

Those skilled in the art will also appreciate that numerous changes and modifications could be made to the embodiment described herein without departing in any way from the invention. These changes and modifications and all obvious variations of the disclosed embodiment are intended to be embraced by the claims to the limits set by law.

What is claimed is:

1. A multilayer switching assembly for switching high frequency signals using MEMS structures comprising:

a substrate having a first layer with an upper surface, a second layer, a third layer, and a fourth layer with a bottom surface;

said first layer, said second layer, said third layer, and said fourth layer made of an insulating material, said first layer separated from said second layer by a first conductor, said second layer separated from said third layer by a segmented second conducting layer, said third layer separated from said fourth layer by a third conductor, said first conductor and said third conductor connected to ground potential, said segmented second conducting layer spaced from said first conductor and said third conductor to form a stripline having a characteristic impedance along said segmented second conducting layer;

a center conductor traversing said first layer, said second layer, said third layer, and said fourth layer, said center conductor carrying said high frequency signals to be switched by said MEMS structures;

an outer via around said center conductor, said outer via traversing said second layer, said third layer, and said fourth layer, said outer via made of conducting material and connected to said first conductor and said third conductor, said outer via spaced from said center conductor to maintain said characteristic impedance along the length of said center conductor, whereby said outer via shields said high frequency energy traveling along said center conductor from propagating outside said outer via;

said center conductor connected to a first end of a coplanar waveguide, said coplanar waveguide placed along said upper surface, a second end of said coplanar waveguide connected using input bondwire to a first high frequency input of a first MEMS structure;

a control conductor traversing said first layer, said second layer, said third layer, and said fourth layer, to connect a control bondwire to a control input contact point on said bottom surface of said fourth layer, said control bondwire also connected to a control input of said first MEMS structure;

a first conducting descender connected to an output of said first MEMS structure using a high frequency output bondwire, said first conducting descender traversing said first layer and said second layer, said first conducting descender also connected to said first segment, said first segment part of said segmented second conducting layer, said first segment connected to a second riser, said second riser traversing said first and said second layer, and connected to a second high frequency input bondwire, said second input bondwire connected to a second MEMS structure.

2. An assembly as claimed in claim 1 wherein said said first layer, said second layer, said third layer, and said fourth layer are made of a ceramic material.

3. An assembly as claimed in claim 1 wherein said characteristic impedance along said segmented second conducting layer and said coplanar waveguide is 50 ohms.

4. An assembly as claimed in claim 1 wherein said high frequency signals have wavelengths between 0.01 millimeters and 100 millimeter.

* * * * *